(12) United States Patent
Summers

(10) Patent No.: US 6,233,122 B1
(45) Date of Patent: May 15, 2001

(54) CAPACITANCE CONTROLLED FLEXIBLE CIRCUIT SUSPENSION

(75) Inventor: Robert Summers, Temecula, CA (US)

(73) Assignee: Magnecomp Corp., Temecula, CA (US)

(*) Notice: Subject to any disclaimer, the term of this patent is extended or adjusted under 35 U.S.C. 154(b) by 0 days.

(21) Appl. No.: 09/384,466

(22) Filed: Aug. 27, 1999

Related U.S. Application Data

(60) Provisional application No. 60/139,311, filed on Jun. 15, 1999.

(51) Int. Cl.[7] ........................................................ G11B 5/60
(52) U.S. Cl. ................................................................. 360/246
(58) Field of Search ................................... 360/245.9, 246

(56) References Cited

U.S. PATENT DOCUMENTS 5,995,328 * 11/1999 Balakrishnan ........................ 360/104

* cited by examiner

Primary Examiner—Robert S. Tupper
(74) Attorney, Agent, or Firm—Louis J. Bachand

(57) ABSTRACT

A disk drive suspension reduces or blocks capacitive coupling between a flexible circuit electrical connector and the steel load beam by interposing a second dielectric layer not part of the flexible circuit between the flexible circuit and the load beam. The change in capacitive coupling is realized without changing the mechanical properties of the flexible circuit, which can still be used to form the suspension flexure.

18 Claims, 2 Drawing Sheets

CAPACITANCE CONTROLLED FLEXIBLE CIRCUIT SUSPENSION

REFERENCE TO RELATED APPLICATION

This application claims the benefit of U.S Provisional Application Ser. No. 60/139,311 filed Jun. 15, 1999.

BACKGROUND OF THE INVENTION

1. Field of the Invention

This invention relates to disk drive suspensions, and more particularly to disk drive suspensions using flexible circuit trace conductors for electrical connection of the slider head to the device electronics without the presence of undue capacitive coupling between the load beam and the trace conductors. In a particular aspect, the invention relates to disk drive suspensions having a second dielectric film between the load beam and the trace conductors that serves to reduce or eliminate electrical interference from capacitive coupling, but which is not connected to the flexible circuit at the distal portion thereof. Thus where the flexible circuit defines a flexure there is no second dielectric layer attached to the flexible circuit so that desirable mechanical properties of the suspension are retained while the electrical properties improved.

2. Related Art

Flexible circuit comprising a dielectric layer and a plurality of trace conductors such as copper traces, with or without an added metal layer, are known to be used to provide the electrical connection in a suspension. Typically, the major part of the flexible circuit electrical connector lies juxtaposed with the load beam, the flexible circuit trace conductors being disposed upon the dielectric plastic film base layer and typically covered with dielectric plastic. The flexible circuit is fixed to the load beam at spaced locations along their mutual extents, with an air gap between the load beam and the flexible circuit between the points of attachment. With reference to FIG. 3, PRIOR ART, the suspension 8 is shown to include a load beam 9, and a flexible circuit 11 spaced from the load beam across an air gap 4. The flexible circuit 11 comprises trace conductors 5 that tend to capacitively couple with the load beam 9, a dielectric layer 6 that is too thin to effectively block capacitive coupling, e.g. 0.001 inch thick, and a cover of insulating plastic 7. Increasing the thickness of the dielectric layer 6 is potentially effective to block capacitive coupling but the mechanical properties of the resulting circuit are too compromised. For example, the flexibility of the flexible circuit 11 is decreased by having a thicker dielectric layer 6 to the point that the utility of the flexible circuit to define a flexure at the distal portion of the circuit, as is desirable, is negated.

SUMMARY OF THE INVENTION

The invention uses a second dielectric layer, not attached to the flexible circuit distal portion, but in place to block capacitive coupling between the load beam and the trace conductors.

It is an object, therefore, of the present invention to provide an improved disk drive suspension. It is another object to provide a disk drive suspension having excellent electrical high frequency response through the control and elimination of capacitive coupling between the trace conductors of the flexible circuit electrical connector and the steel load beam without adverse effect on the suspension mechanical properties. A further object is the provision of a disk drive suspension in which the tendency to capacitive coupling between the flexible circuit trace conductors and the load beam is limited or eliminated by the interposition of a capacitive coupling blocking-effective, substantial additional dielectric member between the load beam and the flexible circuit, the added member being attached to the load beam but free of attachment to the flexible circuit distal portion not opposite the load beam so as to affect the electrical but not the mechanical properties of the disk drive suspension assembly.

These and other objects of the invention to become apparent hereinafter are realized in a disk drive suspension comprising a steel load beam and an electrical connector comprising a flexible circuit comprising dielectric plastic film and trace conductors disposed thereon in capacitive coupling proximity across an air gap to the load beam, the dielectric film being a first dielectric film and having a thickness providing the electrical connector predetermined mechanical properties but inadequate to block capacitive coupling of the trace conductors with the steel load beam across the air gap, a second dielectric film interposed in the air gap between the load beam and the flexible circuit, the second dielectric film having a thickness adequate to block the capacitive coupling, the second dielectric film being sandwiched between the load beam and the electrical connector, whereby capacitive coupling between the load beam and the trace conductors is blocked without increasing the thickness of the first dielectric film or varying the predetermined mechanical properties.

In this and the following embodiment, typically, the electrical conductor flexible circuit has a distal portion shaped to define a slider- supporting flexure, the distal portion being free of the second dielectric, the load beam has left and right edge rails, the electrical connector being disposed between the edge rails, the first dielectric film is a polyimide plastic film, the polyimide plastic first dielectric film has thickness of less than about 0.001 inch. the second dielectric film is a polyimide plastic film, adhesively attached to the load beam, the second dielectric film has a thickness of greater than about 0.002 inch, or more particularly, the second dielectric film has a thickness between about 0.002 and 0.006 inch, and the second dielectric film is adhesively attached to the portion of the flexible circuit that is opposite the load beam.

In a preferred embodiment, the invention provides a disk drive suspension comprising a stainless steel load beam and a flexible circuit electrical connector comprising a laminate of dielectric plastic film and a plurality of trace conductor pairs disposed thereon in capacitive coupling proximity to the load beam in a capacitance zone defined by opposing portions of the load beam and the flexible circuit electrical connector, the flexible circuit connector having a distal portion beyond the capacitance zone, the dielectric film being a first dielectric film and having a thickness providing the flexible circuit electrical connector predetermined mechanical properties within and beyond the capacitance zone but inadequate to block capacitive coupling of the trace conductors with the opposing steel load beam in the capacitance zone, a second dielectric film bonded between the opposing load beam and flexible circuit electrical connector portions, the second dielectric film having a thickness adequate to block the capacitive coupling, whereby capacitive coupling between the load beam and the trace conductors is blocked without increasing the thickness of the first dielectric film or varying the predetermined mechanical properties in the flexible circuit electrical connector distal portion.

BRIEF DESCRIPTION OF THE DRAWINGS

The invention will be further described in conjunction with the attached drawings in which.

DETAILED DESCRIPTION

Figure 1:
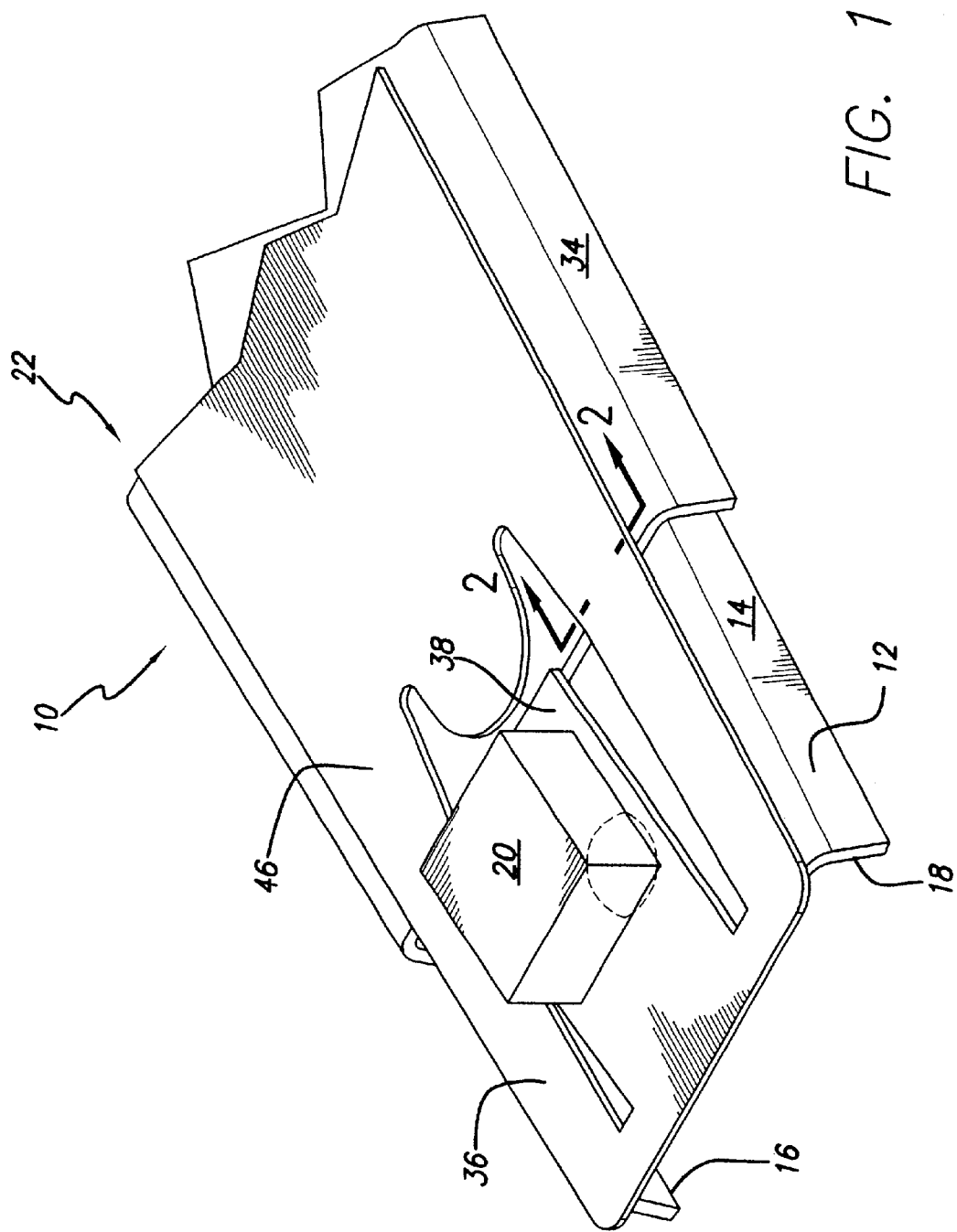
FIG. 1 is an oblique view of the invention suspension.
Figure 2:
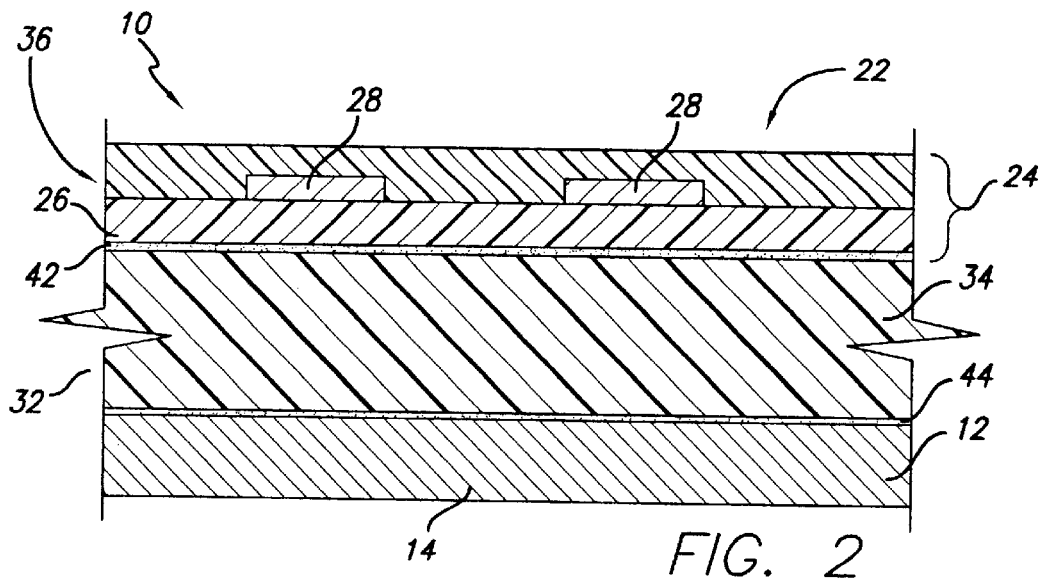
FIG. 2 is a view taken on line 2—2 in FIG. 1.
Figure 3:
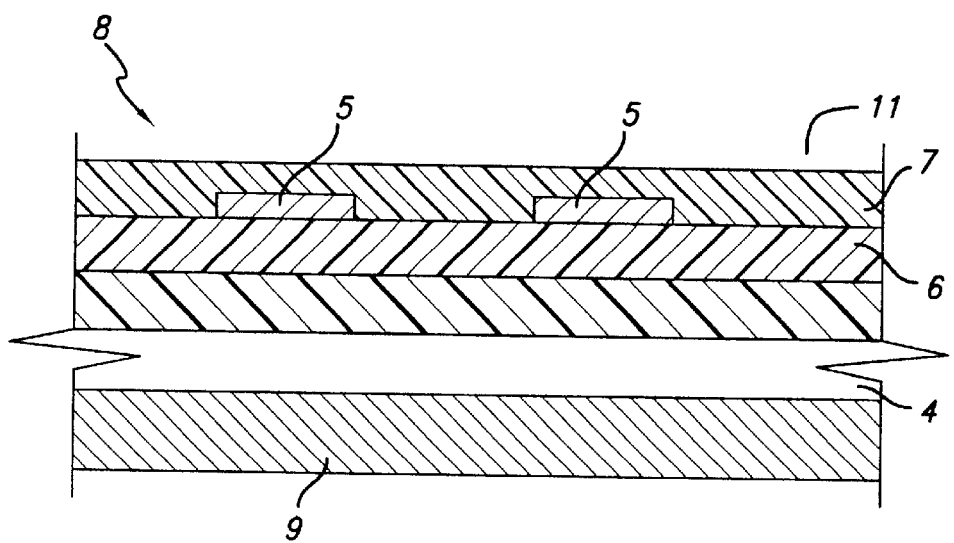
FIG. 3 is a view like FIG. 2 but of a PRIOR ART suspension.

With reference to FIGS. 1 and 2, the invention disk drive suspension is shown at 10 and comprises a stainless steel load beam 12 having a rigid portion 14 with left and right edge rails 16, 18. The suspension 10 further includes an electrical connector 22 comprising a flexible circuit 24 of a dielectric plastic film layer 26 and trace conductors 28 disposed thereon in capacitive coupling proximity across an air gap 32 to the load beam 12. Electrical connector 22 is electrically connected to slider 20. The dielectric film layer 26 is a first dielectric film and has a thickness, typically, of about 0.001 inch, sufficient to provide the electrical connector 22 predetermined mechanical properties but inadequate to block capacitive coupling of the trace conductors 28 with the load beam 12 across the air gap 32. Thus, the invention suspension 10 has a second dielectric film layer 34 interposed in the air gap 32 between the load beam 12 and the flexible circuit 24. Second dielectric film layer 34 has a thickness, typically, in the range of 0.002 to 0.006 inch, and preferably about 0.002 inch, and adequate to block the capacitive coupling. The second dielectric film layer 34 is sandwiched between the load beam 12 and the electrical connector 22, essentially filling the gap 32. The increased dielectric barrier resulting from the presence of the second dielectric layer effectively blocks capacitive coupling between the load beam 12 and the trace conductors 28; achieving this result without increasing the thickness of the first dielectric film layer 26 or thereby varying the predetermined mechanical properties.

Preferably, the electrical connector flexible circuit 24 has its distal portion 36 shaped to define a slider- supporting flexure 38. The flexible circuit distal portion 36 is free of the second dielectric layer 34 so as to have the predetermined mechanical properties essential to the flexure function, including the flexibility associated with only the thinner first dielectric layer 26. Inward of the flexible circuit distal portion 36 the flexible circuit 24 is adhered to the second dielectric layer 34 with a suitable adhesive 42 such as Acrylic R/Flex 2000 ex Rogers Corp., Chandler, Arizona. The second dielectric layer 34 is further similarly adhered to the load beam with adhesive 44.

As noted above, the first and second dielectric film layers typically comprise a polyimide plastic film.

The second dielectric layer 34 is used where there is a portion of load beam 12 opposite the trace conductors or trace conductors 28 and capacitive coupling takes place. Those areas are collectively termed herein a capacitance zone, that is a volume or zone 46 where capacitive coupling can take place. Zone 46 does not extend to the distal portion 36 of the flexible circuit 24, and thus neither does the second dielectric layer 34.

The invention thus provides a disk drive suspension having excellent electrical high frequency response through the control and elimination of capacitive coupling between the trace conductors of the flexible circuit electrical connector and the steel load beam without adverse effect on the suspension mechanical properties, by the interposition of a capacitive coupling blocking-effective, substantial additional dielectric member between the load beam and the flexible circuit, the added member being attached to the load beam but free of attachment to the flexible circuit distal portion not opposite the load beam so as to affect the electrical but not the mechanical properties of the disk drive suspension assembly. The foregoing objects are thus met.

I claim:

1. A disk drive suspension comprising a steel load beam and an electrical connector comprising a flexible circuit comprising dielectric plastic film and trace conductors disposed thereon across an air gap to said load beam, said dielectric film being a first dielectric film and having a thickness providing said electrical connector predetermined mechanical properties but inadequate to block capacitive coupling of said trace conductors with said steel load beam across said air gap, a second dielectric film in said air gap between said load beam and said flexible circuit, said second dielectric film having a thickness adequate to block said capacitive coupling, said second dielectric film being secured between said load beam and said electrical connector, said second dielectric film being free of trace conductors, whereby capacitive coupling between said load beam and said trace conductors is blocked without increasing the thickness of said first dielectric film or varying said predetermined mechanical properties.

2. A disk drive suspension comprising a steel load beam and an electrical connector comprising a flexible circuit of a dielectric plastic film and trace conductors disposed thereon across an air gap to said load beam, said dielectric film being a first dielectric film and having a thickness providing said electrical connector predetermined mechanical properties but inadequate to block capacitive coupling of said trace conductors with said steel load beam across said air gap, said electrical conductor flexible circuit having a distal portion shaped to define a slider-supporting flexure, a second dielectric film in said air gap between said load beam and said flexible circuit, said second dielectric film having a thickness adequate to block said capacitive coupling, said second dielectric film being secured between said load beam and said electrical connector, said distal portion being free of said second dielectric. whereby capacitive coupling between said load beam and said trace conductors is blocked without increasing the thickness of said first dielectric film or varying said predetermined mechanical properties.

3. The disk drive suspension according to claim 1, in which said load beam has left and right edge rails, said electrical connector being disposed between said edge rails.

4. The disk drive suspension according to claim 1, in which said first dielectric film is a polyimide plastic film.

5. The disk drive suspension according to claim 4, in which said polyimide plastic first dielectric film has thickness of less than about 0.001 inch.

6. The disk drive suspension according to claim 1, in which said first dielectric film has thickness of less than about 0.001 inch.

7. The disk drive suspension according to claim 1, in which said second dielectric film is a polyimide plastic film, adhesively attached to said load beam.

8. The disk drive suspension according to claim 7, in which said second dielectric film has a thickness of greater than about 0.002 inch.

9. The disk drive suspension according to claim 1, in which said second dielectric film has a thickness of greater than about 0.002 inch.

10. The disk drive suspension according to claim 9, in which said second dielectric film has a thickness between about 0.002 and 0.006 inch, and is adhesively attached to the portion of the flexible circuit that is opposite to the load beam.

11. A disk drive suspension comprising a stainless steel load beam and a flexible circuit electrical connector comprising a laminate of dielectric plastic film and a plurality of trace conductor pairs disposed thereon in a capacitance zone defined by opposing portions of said load beam and said flexible circuit electrical connector, said flexible circuit connector having a distal portion beyond said capacitance zone, said dielectric film being a first dielectric film and having a thickness providing said flexible circuit electrical connector predetermined mechanical properties within and beyond said capacitance zone but inadequate to block capacitive coupling of said trace conductors with said opposing steel load beam in said capacitance zone, a second dielectric film free of trace conductors and bonded between said opposing load beam and flexible circuit electrical connector portions, said second dielectric film having a thickness adequate to block said capacitive coupling, whereby capacitive coupling between said load beam and said trace conductors is blocked without increasing the thickness of said first dielectric film or varying said predetermined mechanical properties in said flexible circuit electrical connector distal portion.

12. The disk drive suspension according to claim 11, in which said flexible circuit electrical connector distal portion is shaped to define a slider-supporting flexure, said distal portion being free of said second dielectric.

13. The disk drive suspension according to claim 12, in which said load beam has left and right edge rails, said flexible circuit electrical connector being disposed between said edge rails.

14. The disk drive suspension according to claim 13, in which said first dielectric film is a polyimide plastic film.

15. The disk drive suspension according to claim 14, in which said polyimide plastic first dielectric film has thickness of less than about 0.001 inch.

16. The disk drive suspension according to claim 15, in which said second dielectric film is a polyimide plastic film.

17. The disk drive suspension according to claim 16 in which said second dielectric film has a thickness of greater than about 0.002 inch.

18. The disk drive suspension according to claim 17, in which said second dielectric film has a thickness between about 0.002 and 0.006 inch.

* * * * *